US007825328B2

(12) United States Patent
Li

(10) Patent No.: US 7,825,328 B2
(45) Date of Patent: Nov. 2, 2010

(54) NITRIDE-BASED MULTI-JUNCTION SOLAR CELL MODULES AND METHODS FOR MAKING THE SAME

(75) Inventor: Jizhong Li, Bordentown, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 96 days.

(21) Appl. No.: 12/031,338

(22) Filed: Feb. 14, 2008

(65) Prior Publication Data
US 2008/0245400 A1  Oct. 9, 2008

Related U.S. Application Data

(60) Provisional application No. 60/922,484, filed on Apr. 9, 2007.

(51) Int. Cl.
*H02N 6/00* (2006.01)
(52) U.S. Cl. ............... 136/249; 136/262; 136/244; 136/252; 136/256; 136/255; 257/436; 257/443; 257/448; 257/458; 438/74; 438/77; 438/80
(58) Field of Classification Search ............... 136/262, 136/252, 249, 244, 256, 255; 257/436, 443, 257/448, 459; 438/74, 77, 80
See application file for complete search history.

(56) References Cited

U.S. PATENT DOCUMENTS

| 4,370,510 | A |   | 1/1983  | Stirn |
| 5,223,043 | A |   | 6/1993  | Olson et al. |
| 5,405,453 | A |   | 4/1995  | Ho et al. |
| 5,407,491 | A |   | 4/1995  | Freundlich et al. |
| 5,853,497 | A | * | 12/1998 | Lillington et al. ............ 136/249 |
| 6,121,542 | A | * | 9/2000  | Shiotsuka et al. ........... 136/256 |
| 6,252,287 | B1 |  | 6/2001  | Kurtz et al. |
| 6,552,259 | B1 |  | 4/2003  | Hosomi et al. |
| 6,951,819 | B2 |  | 10/2005 | Iles et al. |

(Continued)

FOREIGN PATENT DOCUMENTS

WO    WO03/073517 A1 *  4/2003

OTHER PUBLICATIONS

Groenert et al., "Monolithic Integration of Room-Temperature cw GaAs/AlGaAs Lasers on Si Substrates via Relaxed Graded GeSi Buffer Layers," Journal of Applied Physics, vol. 93, No. 1, Jan. 1, 2003, pp. 362-367.

(Continued)

*Primary Examiner*—Jeffrey T Barton
*Assistant Examiner*—Devina Pillay
(74) *Attorney, Agent, or Firm*—Slater & Matsil, L.L.P.

(57) ABSTRACT

A backside illuminated multi-junction solar cell module includes a substrate, multiple multi-junction solar cells, and a cell interconnection that provides a series connection between at least two of the multi-junction solar cells. The substrate may include a material that is substantially transparent to solar radiation. Each multi-junction solar cell includes a first active cell, grown over the substrate, for absorbing a first portion of the solar radiation for conversion into electrical energy and a second active cell, grown over the first active cell, for absorbing a second portion of the solar radiation for conversion into electrical energy. At least one of the first and second active cells includes a nitride.

24 Claims, 3 Drawing Sheets

U.S. PATENT DOCUMENTS

| | | | |
|---|---|---|---|
| 7,122,733 | B2 | 10/2006 | Narayanan et al. |
| 7,217,882 | B2 * | 5/2007 | Walukiewicz et al. ....... 136/252 |
| 2004/0118451 | A1 * | 6/2004 | Walukiewicz et al. ....... 136/262 |
| 2005/0211291 | A1 | 9/2005 | Bianchi |
| 2005/0274409 | A1 | 12/2005 | Fetzer et al. |
| 2006/0144435 | A1 | 7/2006 | Wanlass |
| 2006/0162768 | A1 | 7/2006 | Wanlass et al. |

OTHER PUBLICATIONS

Hayafuji et al., "Effect of Employing Positions of Thermal Cyclic Annealing and Strained-Layer Superlattice on Defect Reduction in GaAs-on-Si," Japanese Journal of Applied Physics, vol. 29, No. 11, Nov. 1990, pp. 2371-2375.

Kazi et al., "Realization of GaAs/AlGaAs Lasers on Si Substrates Using Epitaxial Lateral Overgrowth by Metalorganic Chemical Vapor Deposition" Japanese Journal of Applied Physics, vol. 40, Part 1, No. 8, Aug. 2001, pp. 4903-4906.

Ringel et al. "Single-Junction InGaP/GaAs Solar Cells Grown on Si Substrates with SiGe Buffer Layers," Progress in Photovoltaics: Research and Applications, vol. 10, Issue 6, Aug. 27, 2002, pp. 417-426.

Yamaguchi et al., "GaAs Solar Cells Grown on Si Substrates for Space Use," Progress in Photovoltaics: Research and Applications, vol. 9, Issue 3, May 24, 2001, pp. 191-201.

Yamaguchi et al., "Super-High-Efficiency Multi-Junction Solar Cells," Progress in Photovoltaics: Research and Applications, vol. 13, Issue 2, Feb. 18, 2005, pp. 125-132.

Yamaguchi et al., "Defect Reduction Effects in GaAs on Si Substrates by Thermal Annealing," Appl. Phys. Lett. vol. 53, No. 23, Dec. 5, 1988, pp. 2293-2295.

* cited by examiner

NITRIDE-BASED MULTI-JUNCTION SOLAR CELL MODULES AND METHODS FOR MAKING THE SAME

CROSS-REFERENCE TO RELATED APPLICATION

This application claims priority to and the benefit of U.S. provisional patent Application No. 60/922,484, filed on Apr. 9, 2007, the disclosure of which is hereby incorporated herein by reference in its entirety.

TECHNICAL FIELD

The invention generally relates to solar cells. More particularly, the invention relates to III-nitride-material based monolithic multi-junction (MJ) solar cells, their related photovoltaic devices, and methods for making the same.

BACKGROUND

Solar photovoltaic devices (i.e., solar cells) are devices capable of converting solar radiation into usable electrical energy. Commonly used semiconductor solar cell devices are typically composed of one or more pairs of p-n junction cells, which include a p-type semiconductor layer adjacent an n-type semiconductor layer. Energy conversion occurs as solar radiation impinging on the solar cell and absorbed by an active region of semiconductor material generates electricity. If properly designed, multi-junction solar cells may be more efficient than single-junction solar cells, because a larger portion of the solar spectrum can be captured.

In order for the solar cell device to be economical and highly efficient, there must be an availability of high quality semiconductor materials, a flexible choice of junction bandgaps covering a broad solar spectrum, and an appropriate device architecture design that maximizes current match and minimizes electrical/optical losses. In addition, the solar cell device should minimize environmental pollution and manufacturing cost. To date, high-efficiency III-V semiconductor multi-junction solar cells have typically been grown on GaAs, InP, and Ge substrates using GaInP, and (In)GaAs cell structures to absorb solar radiation energy between 0.7 eV and 1.8 eV. Several such designs are described in U.S. Pat. Nos. 5,223,043; 5,405,453; and 5,407,491. However, significant fractions of solar radiation at wavelengths longer than 900 nm and shorter than 700 nm generally have not been effectively used due to material band gap limits in existing solar cells.

Environmental hazards are another issue with existing solar cells, such as with conventional III-V solar cell devices composed of GaAs and InGaP, which are environmentally hazardous elements after material decomposition. Also, the cost of using substrates such as GaAs and Ge is high.

SUMMARY OF THE INVENTION

The present invention realizes full-solar-spectrum, high-efficiency, robust, and low cost solar cells and photovoltaic (PV) devices using III-nitride semiconductor compounds. Because the energy band gap of a III-nitride material system can be engineered from 0.7 eV to 6.0 eV, III-nitride-based solar cells can absorb solar energy from a much wider spectrum. In addition, as compared with conventional solar cell manufacturing techniques, major environmental pollution issues related to material growth, device fabrication, material handling, and disposal are avoided by using III-nitride semiconductor compounds. The III-nitride-based multi-junction solar cells of the present invention possess many useful advantages in, for example, space applications, such as satellites, spacecraft, or space stations, and terrestrial applications that can benefit from low maintenance and long lasting sources of solar-generated electricity, such as facilities remote from main electrical grids or outback telecommunications stations.

In one embodiment of the invention, a monolithic multi-junction solar cell device includes III-nitride alloys grown on a sapphire substrate. This solar cell device, in contrast to conventional III-V solar cell devices, may exhibit the following features and advantages. First, III-nitride materials (such as GaN, InN, AlN, or their ternary or quaternary alloys) may be used to construct the tandem solar cell on a double-side polished solar-transparent substrate, such as sapphire. The full cell structure may be monolithically grown using appropriate thin-film deposition techniques such as metal-organic chemical vapor deposition (MOCVD), molecular beam epitaxy (MBE), or other appropriate processes. Second, a monolithic interconnected module (MIM) may be used to form internal circuit connections. The size of the MIM array is only limited by the size of the substrate upon which growth takes place. This enables fabricating larger-area solar cell arrays. Third, the fabrication of the MIM can be accomplished using standard industrial photolithographic processes, which permits changes in circuit design by simply altering the photomask pattern and device architecture. Fourth, a double-side polished substrate may be used as a solar cell cover sheet by flip-chip wafer bonding. Such substrates offer many advantages over conventional glass sheet materials, including a higher radiation damage threshold, a maximal effective solar absorption area, and a higher broad-band solar transmission efficiency.

In general, in one aspect, the invention features a backside illuminated multi-junction solar cell module. The solar cell module includes a substrate, multiple multi-junction solar cells, and a cell interconnection that provides a series connection between at least two of the multi-junction solar cells. The substrate includes a material substantially transparent to solar radiation. Each multi-junction solar cell includes a first active cell, grown over the substrate, for absorbing a first portion of the solar radiation for conversion into electrical energy and a second active cell, grown over the first active cell, for absorbing a second portion of the solar radiation for conversion into electrical energy. At least one of the first and second active cells includes a nitride.

In general, in another aspect, the invention features a method for making a monolithic interconnected module. The method includes forming a plurality of solar cell mesas over a substrate, providing on each mesa a first active cell for absorbing solar radiation for conversion into electrical energy, providing over each first active cell a second active cell for absorbing solar radiation for conversion into electrical energy, and electrically connecting the plurality of solar cell mesas. The plurality of solar cell mesas may be electrically connected in series or in parallel. Alternatively, a first portion of the plurality of solar cell mesas may be electrically connected in series and a second portion electrically connected in parallel. At least one of the first and second active cells of each mesa includes a nitride.

In various embodiments of these aspects of the invention, both the first and second active cells of at least one multi-junction solar cell or mesa include a nitride, such as a III-nitride material. For example, the first active cell may include gallium nitride and the second active cell may include indium gallium nitride. At least one of the first and second active cells may also include a ternary or quaternary alloy. The first active cell may be grown to absorb solar energy between approximately 3.4 electrovolts and approximately 4.0 electrovolts, while the second active cell may be grown to absorb solar energy between approximately 2.0 electrovolts and approximately 3.4 electrovolts. An interconnecting tunnel junction may be provided between the first and second active cells of at least one multi-junction solar cell or mesa. The interconnecting tunnel junction may facilitate the flow of photogenerated electrical current between the first and second active cells and may include a nitride, such as, for example, gallium nitride.

In another embodiment, a third active cell for absorbing solar radiation for conversion into electrical energy is grown over the second active cell of at least one multi-junction solar cell or mesa. The third active cell may include a nitride, such as, for example, indium nitride, and may be grown to absorb solar energy between approximately 0.7 electrovolts and approximately 2.0 electrovolts. An interconnecting tunnel junction may be provided between the second and third active cells of at least one multi-junction solar cell or mesa. The interconnecting tunnel junction may facilitate the flow of photogenerated electrical current between the second and third active cells and may include a nitride, such as, for example, indium gallium nitride.

In the above embodiments, the second active cell of at least one multi-junction solar cell or mesa may be grown to absorb a narrower band of solar energy than its first active cell. Similarly, the third active cell of at least one multi-junction solar cell or mesa may be grown to absorb a narrower band of solar energy than both its first and second active cells. The substrate over which the first active cells may be grown or disposed may include a material that is substantially transparent to solar radiation and/or a material that is electrically unconductive. For example, the substrate may include sapphire.

A dielectric thin film and/or a contact grid may be deposited on at least one of the multi-junction solar cells or mesas prior to electrically connecting the solar cells or mesas. The plurality of multi-junction solar cells or mesas may also be bonded to an electrically isolated carrier, such as, for example, a glass plate.

In general, in yet another aspect, the invention features a method for making a backside illuminated monolithic interconnected module. The method includes providing a transparent substrate having a top and bottom, providing an array of solar cells above the top of the substrate, and positioning the bottom of the substrate to face a radiation source.

In various embodiments of this aspect of the invention, the substrate includes or consists essentially of a sapphire material. At least one of the solar cells may be a multi-junction solar cell and may include a III-nitride material.

BRIEF DESCRIPTION OF THE DRAWINGS

The foregoing and other objects, aspects, features, and advantages of the invention will become more apparent and may be better understood by referring to the following description taken in conjunction with the accompanying drawings, in which.

DESCRIPTION

In general, the present invention pertains to III-nitride-material based monolithic multi-junction solar cells, their related photovoltaic devices, and methods for making the same.

Figure 1:
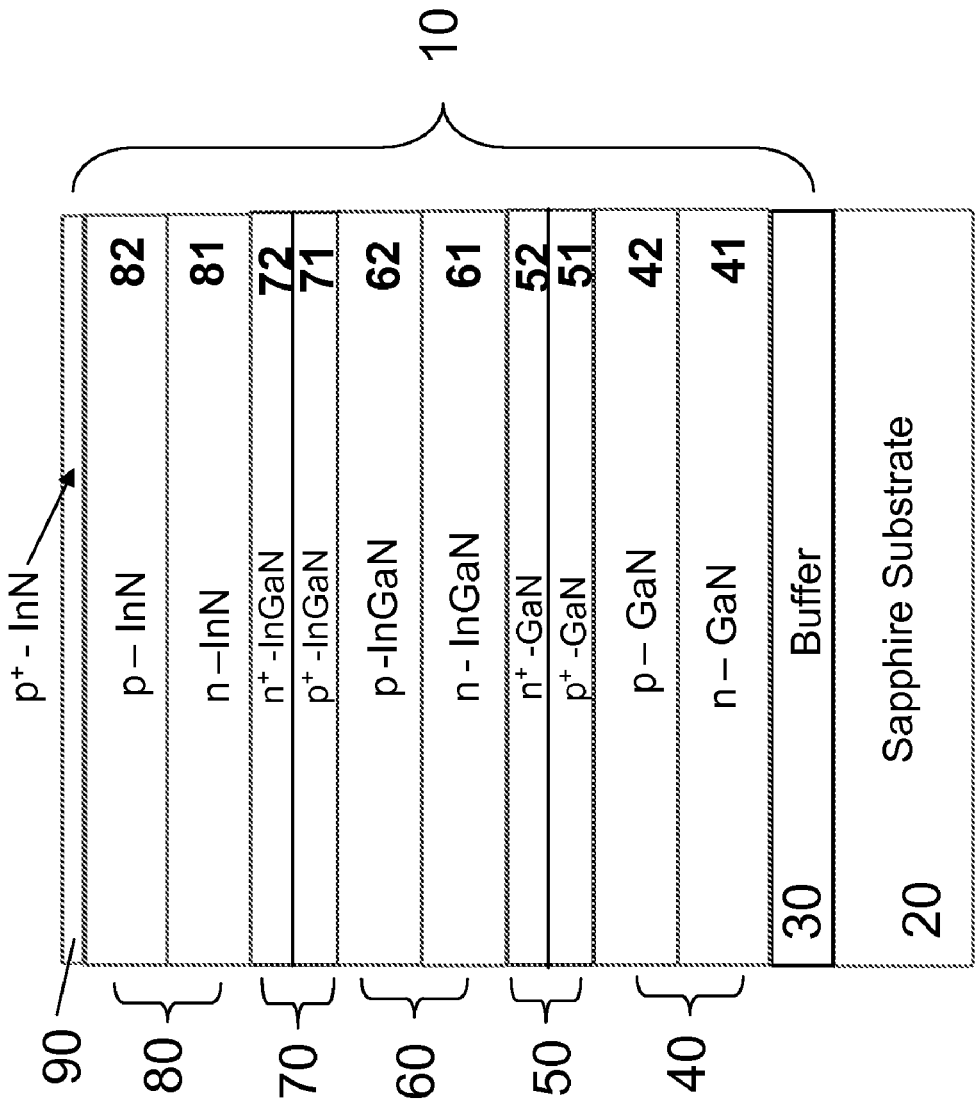
FIG. 1 is a sectional view of one embodiment of a three-junction solar cell device structure.

FIG. 1 depicts a sectional view of an exemplary embodiment of a three-junction solar cell device structure 10 grown on a substrate 20. As shown in the illustrative embodiment, the solar cell device 10 may include, in the order of growth over the substrate 20, a buffer 30, a first cell 40, a first interconnecting tunnel junction 50, a second cell 60, a second interconnecting tunnel junction 70, a third cell 80, and a cap layer 90. Each of the first, second, and third cells 40, 60, 80 may be a p-n junction cell.

In one embodiment, the substrate 20 includes an optically transparent and electrically insulating material having high optical solar-transmission efficiency from the UV to infrared wavelength region. The substrate 20 may be, for example, a double-side polished single-crystal sapphire substrate or a semi-insulating SiC substrate. The buffer layer 30, which is formed over the substrate 20, may include a III-nitride material, such as GaN, AlN, or their alloys.

In the embodiment of FIG. 1 (and also in the embodiments of FIGS. 2-3, discussed below), epitaxial formation of the three-junction solar cell device 10 may include sequentially growing active p-n junctions with wider band-gap semiconductor materials prior to growing junctions with narrower band gap materials. Using this growth sequence reduces possible material heterointerface-diffusion during epitaxy, because the wider bandgap III-nitride material typically requires a higher growth temperature.

In one embodiment, the first p-n junction cell 40 is used for absorbing solar energy in a range from approximately 3.4 eV to approximately 4.0 eV and is grown on the buffer layer 30. The first cell 40 may include at least one n-type layer and one p-type layer, such as an n-type (or p-type) base layer 41 and a p-type (or n-type) emitter layer 42. The base layer 41 and the emitter layer 42 may include or consist essentially of, for example, III-V materials, such as GaN—GaN or AlGaN—AlGaN homojunction layers or their heterostructural GaN—AlGaN format.

The first tunnel junction 50 may be formed to facilitate the flow of photogenerated electrical current between the first cell 40 and the second cell 60. The first tunnel junction 50 may take a number of forms to provide a thin layer of material (usually the same material as the emitter layer 42 of the first cell 40 or as an overlying base layer 61 of the second cell 60) that allows current to pass between the first and second cells 40, 60 without generating a voltage drop large enough to significantly decrease the conversion efficiency of the device 10. For example, as illustrated in FIG. 1, each of the layers 51, 52 of the first tunnel junction 50 may include or consist essentially of GaN.

In one embodiment, the second cell 60 is used for absorbing solar energy in a range from approximately 2.0 eV to approximately 3.4 eV. The second cell 60 may include at least an n-type (or p-type) base layer 61 and a p-type (or n-type) emitter layer 62. The material for the second cell 60 may include or consist essentially of InGaN, with constant indium composition or graded indium content.

The second tunnel junction 70 may be used to facilitate the flow of photogenerated electrical current between second cell 60 and the third cell 80. The second tunnel junction 70 may take any of a number of forms to provide a thin layer of material (usually the same material as either the emitter layer 62 of the second cell 60 or the base layer 81 of the overlying third cell 80) that allows current to pass between the second cell 60 and the third cell 80 without generating a voltage drop large enough to significantly decrease the conversion efficiency of the device 10. For example, as illustrated in FIG. 1, each of the layers 71, 72 of the second tunnel junction 70 may include or consist essentially of InGaN.

For the illustrated three-junction version of the solar cell device 10, the third cell 80 is the last cell, covering optical absorption in the range of approximately 0.7 eV to approximately 2.0 eV. The third cell 80 may include at least an n-type (or p-type) base layer 81 and a p-type (or n-type) emitter layer 82. The material for either the base layer 81 or the emitter layer 82 may include or consist essentially of InN with constant indium composition or graded indium content. In the illustrated embodiment, the cap layer 90 is the final deposited layer for making internal electrical contact for an MIM module, and may include or consist essentially of, for example, InN, GaN, or InGaN. As an alternative to III-nitride materials, diluted nitride may be used as appropriate, for example in base layer 81 and emitter layer 82 of the third cell 80.

Solar cell device 10 may be formed by any suitable epitaxial deposition system or combination of systems, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In the CVD process, exemplary source materials would include trimethylgallium (TMG), triethylgallium (TEG), trimethylaluminum (TMA), trimethylindium (TMI), ammonia, or dimethylhydrozane (DMHy). The carrier gas may be, for example, hydrogen or nitrogen. The selection of various precursors and the utilization of different growth methods is understood among those skilled in the art.

In an exemplary process, triple-junction crystalline material 10 is grown using MOCVD. In accordance with that process, the double-side polished-sapphire substrate 20 is first thermally annealed with hydrogen at approximately 1100° C. for 10 minutes with chamber pressure of approximately 50 torr. Then, the temperature is cooled down to approximately 530° C. and the chamber pressure is ramped up to approximately 500 torr for the growth of the buffer layer 30. $NH_3$ pre-exposure is conducted by flowing $NH_3$ gas through the reactor during temperature ramp down. An approximately 30-50 nm thick buffer layer 30 is then grown by introducing TEG into the reactor at approximately 530° C. The thickness and growth optimization of the buffer layer 30 are controlled by in-situ monitoring of the nucleation process on the surface of the sapphire substrate 20.

After growth of the buffer layer 30, the chamber temperature is ramped up to approximately 1050° C. with only $NH_3$ flowing through the reactor. The first GaN cell 40 as shown in FIG. 1 is then grown at approximately 1050° C. using TMG as the precursor. A $SiH_4$ doped 2 μm GaN base layer 41 is grown first, followed by a 1 μm $Cp_2Mg$ doped emitter layer 42. The doping concentration is approximately in the range of $1-5\times10^{17}$ cm$^{-3}$ for both layers 41, 42.

The first interconnecting tunnel junction 50 is then grown, preferably under the same conditions as for the first cell 40, with a 50 nm highly doped n-layer 51 and a 50 nm highly doped p-layer 52. Then, the carrier gas is switched from hydrogen to nitrogen and the temperature is decreased to approximately 850° C. An in-situ thermal annealing at approximately 850° C. for 5 minutes is performed with $N_2$ to activate p-type carriers in pre-grown layers 42 and 52. After annealing, the chamber pressure is increased from approximately 500 torr to approximately 600 torr and the chamber temperature is decreased to approximately 800° C.

The second cell 60 is then grown at approximately 800° C. using TEG and TMI as the precursors. $SiH_4$ is used for n-type doping in the 0.1 μm base layer 61 and $Cp_2Mg$ is used for p-type doping in the 1 μm emitter layer 62. The doping concentration is in the range of approximately $1-3\times10^{17}$ cm$^{-3}$ for both layers. A 50 nm highly doped n-layer 71 and a 50 nm highly doped p-layer 72 are then grown to form the second tunnel junction 70 under the same growth conditions as for the second cell 60. A second thermal annealing is conducted after growing the second interconnecting tunnel junction 70 for 5 minutes in $N_2$ ambient at a temperature of approximately 750° C.

The growth temperature is then further decreased to approximately 680° C. for growing the third cell 80. In this exemplary embodiment, the third cell 80 includes a 50 nm n-type base layer 81 having an approximate doping concentration of $1-5\times10^{19}$ cm$^{-3}$ and a 100 nm p-type emitter layer 82 having an approximate doping concentration of $1\times10^{17}$ cm$^{-3}$. Then, a 100 nm p-type cap layer 90 is grown. A third thermal annealing is conducted after growing layer 90 for 5 minutes in $N_2$ ambient at a temperature of approximately 650° C.

Figure 2:
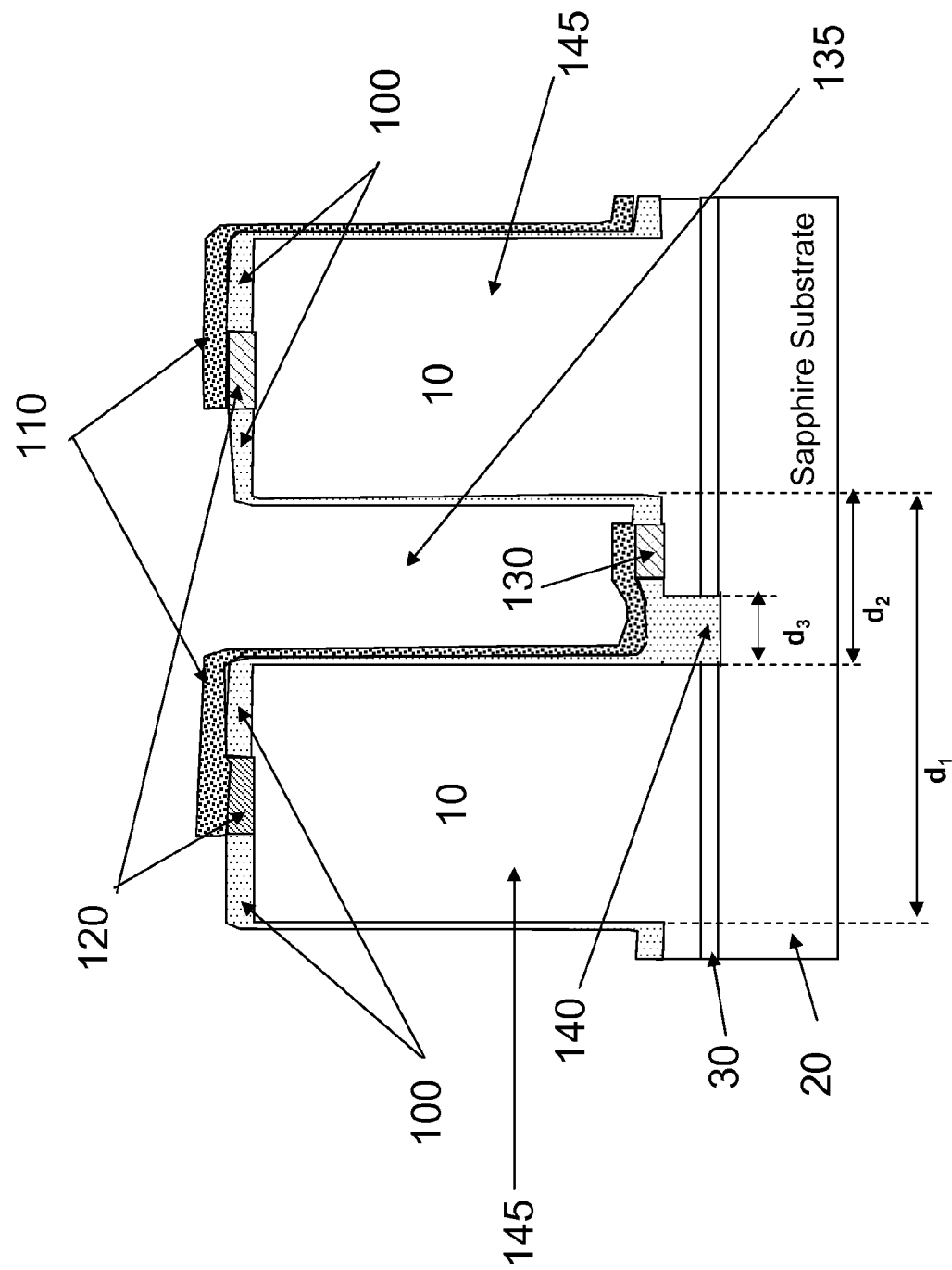
FIG. 2 is a sectional view of one embodiment of a MIM solar cell constructed in accordance with the present invention.

FIG. 2 depicts a sectional view of one embodiment of a MIM solar cell constructed in accordance with the present invention. In one embodiment, after growth of a device 10, a pair of 1×1 cm$^2$ solar cell mesas 145 are formed by etching a first trench 135 that extends through the solar cell device 10 from the cap layer 90 partially into the base layer 41 of the first cell 40. The first trench 135 may have a width $d_2$ of, for example, approximately 10 μm, although other suitable widths may also be used. Moreover, more than one such first trench 135 may be etched. Where more than one such first trench 135 is etched, the distance $d_1$ between the first trenches 135 may be approximately 100 μm, although other suitable distances may also be used.

Then, the remaining portion of the base layer 41 of the first cell 40 and the buffer layer 30 inside the first etched region or trench 135 may both be partially etched out to form a second trench 140 and to isolate individual solar cell mesas 145. The width $d_3$ of the second etched trench 140 may be approximately 2 μm, although other suitable widths may also be used. A dielectric thin film 100, formed from, for example, $SiO_2$ or $SiN_x$, may then be deposited over the wafer in order to reduce current leakage on etched mesa surfaces. This highly reflective passivating film may also function as an optical reflector as described below. Then, 5 μm n-contact grids 130 may be formed by, for example, depositing multiplayer metals such as Al/Ni on the exposed n-GaN template of the base layer 41 of the first cell 40. In addition, 20 μm metal grids 120 may be formed on p-type cap layer 90 by depositing Au/Ti. Internal series connections 110 between individual solar cell mesas 145 are schematically illustrated in FIG. 2. The connections 110 may be made from Au, or other suitable alloys such as Au/Sn.

Because, as illustrated in FIG. 2, individual solar cell mesas 145 are connected in series, voltage may build up across the solar cell mesas 145 while current remains constant. This can lead to smaller power losses for a given area device. For this reason, the MIM itself may become dimensionally large without any outside interconnections. This provides potential advantages in practical applications requiring large panel assemblies.

Alternatively, the individual solar cell mesas 145 may be connected in parallel or, in yet another embodiment, a first portion of the individual solar cell mesas 145 may be connected in series and a second portion may be connected in parallel. Moreover, as will be understood by one skilled in the art, any number of solar cell devices 10 and/or solar cell mesas 145 may be constructed on the substrate 20. In other words, an array of solar cell devices 10 and/or solar cells mesas 145 may be present on the substrate 20.

Figure 3:
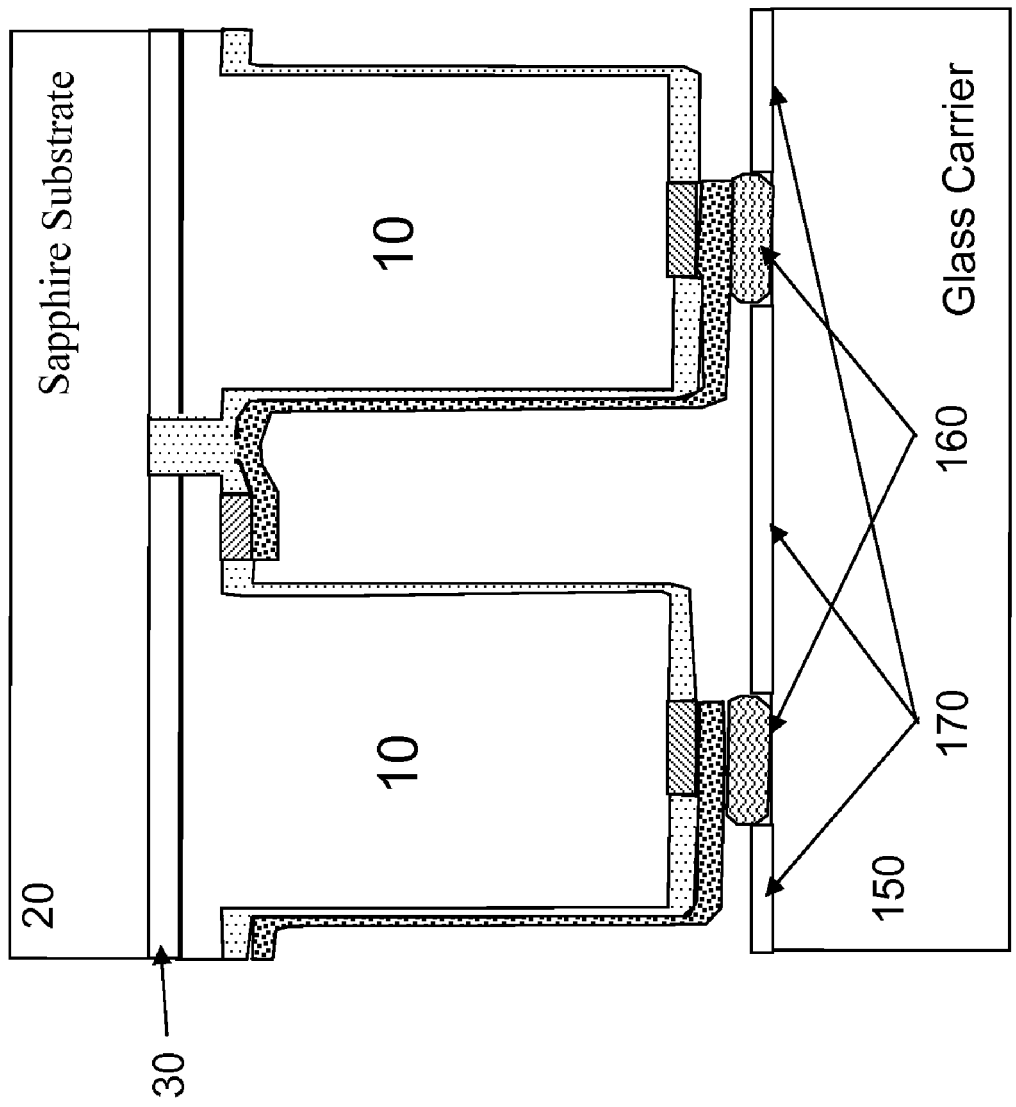
FIG. 3 is a sectional view of one embodiment of a flip-chip wafer bonding scheme.

FIG. 3 depicts a sectional view of one embodiment of a flip-chip wafer bonding scheme. As shown, the MIM solar cell of FIG. 2 has been rotated by 180° so that the bottom surface of the substrate 20 faces upwards and in the direction of a solar radiation source (not shown). Thus, the MIM solar cell is backside illuminated, in the sense that the light from the radiation source enters the bottom surface of the substrate 20 and propagates through the MIM solar cell towards an electrically isolated wafer carrier 150. Because crystal sapphire material has optical characteristics superior to those of standard glass materials, with up to 98.5% transmission and an extremely wide transmission bandwidth from 190 nm to 5 microns, the double-side polished sapphire substrate 20 may be used as the solar cell cover sheet by flip-over wafer bonding. In addition, sapphire's superior radiation-resistance makes it an excellent material for space applications.

Device packaging may be completed by bonding MIM cell arrays with the electrically isolated wafer carrier 150, such as a glass plate, as shown in FIG. 3. Before bonding, 8-10 μm thick indium grids 160 may be deposited on pre-patterned carrier 150 so that grids 160 match the grid pattern of the MIM array. A dielectric layer 170, formed from, for example, $SiO_2$, may be deposited in between the indium grids to provide an optical reflection mirror for photon recycling. Wafer bonding can be performed by various processes as understood by those skilled in the art, for example using a commercial flip-chip bond machine or by other means, such as by manual operation with an appropriate optical microscope. In the illustrated embodiment, the bonding process may be completed through the applied pressure due to the low (156° C.) melting point of indium.

Solar cell embodiments constructed in accordance with the techniques discussed above can provide a higher photovoltaic efficiency than solar cells based on the use of amorphous silicon on silicon substrates, and can be constructed at a cost lower than for solar cells that are based on the use of III-V materials on substrates such as Ge or GaAs. In addition, the back-side illumination feature of an optically transparent substrate such as sapphire, which is desirably used as the interface between the solar cell and the light source, provides advantages over the conventional use of glass because sapphire is harder than glass, can stand up to heat better than glass, and can resist or block particles such as gamma rays and protons better than glass.

Having described certain embodiments of the invention, it will be apparent to those of ordinary skill in the art that other embodiments incorporating the concepts disclosed herein may be used without departing from the spirit and scope of the invention. For example, while the present invention has been described with reference to a three-junction solar cell device structure 10, a person skilled in the art will understand that other embodiments different from device 10, for example one-, two-, four-, or more-junction solar cell device structures, are within the scope of the present invention. In addition, all measurements (e.g., distances, widths, etc.), temperatures, pressures, and time frames mentioned herein to describe the inventive devices and methods of manufacture are approximate (even if not indicated as such) and may be varied slightly to suit a particular application, as will be understood by one of skill in the art. Accordingly, the described embodiments are to be considered in all respects as only illustrative and not restrictive.

What is claimed is:

1. A backside illuminated multi-junction solar cell module, comprising:
    a substrate comprising a material substantially transparent to solar radiation;
    a plurality of multi junction solar cells, each multi-junction solar cell comprising
        a first active cell over the substrate, the first active cell capable of absorbing a first portion of the solar radiation for conversion into electrical energy; and
        a second active cell over the first active cell, the second active cell capable of absorbing a second portion of the solar radiation for conversion into electrical energy,
        wherein at least one of the first and second active cells comprises a nitride;
    a dielectric layer over the plurality of multi-junction solar cells; and
    a cell interconnection that provides a series connection between at least a first multi-junction solar cell and a second multi-junction solar cell of the plurality of multi junction solar cells, wherein the cell interconnection comprises a first contact electrically coupling the first active cell of the first multi junction solar cell through a first opening in the dielectric layer and a second contact electrically coupling the second active cell of the second multi-junction solar cell through a second opening in the dielectric layer.

2. The solar cell module of claim 1, wherein both the first and second active cells of at least one multi junction solar cell comprise a nitride.

3. The solar cell module of claim 2, wherein the first active cell comprises gallium nitride and the second active cell comprises indium gallium nitride.

4. The solar cell module of claim 1, wherein the first active cell of at least one multi junction solar cell absorbs solar energy between approximately 3.4 electrovolts and approximately 4.0 electrovolts.

5. The solar cell module of claim 1, wherein the second active cell of at least one multi-junction solar cell absorbs solar energy between approximately 2.0 electrovolts and approximately 3.4 electrovolts.

6. The solar cell module of claim 1, wherein at least one multi junction solar cell further comprises an interconnecting tunnel junction, between its first active cell and its second active cell, for facilitating flow of photogenerated electrical current between its first active cell and its second active cell.

7. The solar cell module of claim 6, wherein the interconnecting tunnel junction comprises a nitride.

8. The solar cell module of claim 7, wherein the interconnecting tunnel junction comprises gallium nitride.

9. The solar cell module of claim 1, wherein at least one multi-junction solar cell further comprises a third active cell over its second active cell, the third active cell capable of absorbing a third portion of the solar radiation for conversion into electrical energy.

10. The solar cell module of claim 9, wherein the third active cell comprises a nitride.

11. The solar cell module of claim 10, wherein the third active cell comprises indium nitride.

12. The solar cell module of claim 9, wherein the third active cell absorbs solar energy between approximately 0.7 electrovolts and approximately 2.0 electrovolts.

13. The solar cell module of claim 9, wherein the at least one multi junction solar cell further comprises an interconnecting tunnel junction, between its second active cell and its third active cell, for facilitating flow of photogenerated electrical current between its second active cell and its third active cell.

14. The solar cell module of claim 13, wherein the interconnecting tunnel junction comprises a nitride.

15. The solar cell module of claim 14, wherein the interconnecting tunnel junction comprises indium gallium nitride.

16. The solar cell module of claim 1, wherein both the first and second active cells of at least one multi-junction solar cell comprise a III-nitride material.

17. The solar cell module of claim 1, wherein at least one of the first and second active cells of at least one multi-junction solar cell comprises a ternary or quaternary alloy.

18. The solar cell module of claim 1, wherein the substrate comprises a material that is electrically nonconductive.

19. The solar cell module of claim 1, wherein the substrate comprises sapphire.

20. The solar cell module of claim 1 further comprising an electrically isolated carrier bonded to the plurality of multi-junction solar cells.

21. The solar cell module of claim 20, wherein the electrically isolated carrier is a glass plate.

22. The solar cell module of claim 1, wherein the dielectric layer is an optically reflective layer.

23. The solar cell module of claim 1, wherein the first portion of solar radiation is substantially greater than the second portion of solar radiation.

24. The solar cell module of claim 1, wherein the first portion of solar radiation and the second portion of solar radiation are substantially exclusive of each other.

* * * * *